United States Patent
Wan et al.

(10) Patent No.: US 12,046,630 B2
(45) Date of Patent: Jul. 23, 2024

(54) MANUFACTURING METHOD OF SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Qiang Wan, Hefei (CN); Kangshu Zhan, Hefei (CN); Jun Xia, Hefei (CN); Sen Li, Hefei (CN); Penghui Xu, Hefei (CN); Tao Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 380 days.

(21) Appl. No.: 17/452,160

(22) Filed: Oct. 25, 2021

(65) Prior Publication Data

US 2022/0352305 A1 Nov. 3, 2022

Related U.S. Application Data

(63) Continuation of application No. PCT/CN2021/109777, filed on Jul. 30, 2021.

(30) Foreign Application Priority Data

Apr. 29, 2021 (CN) .......................... 202110476539.4

(51) Int. Cl.
*H01L 29/94* (2006.01)
*H01L 29/06* (2006.01)
(Continued)

(52) U.S. Cl.
CPC ...... *H01L 29/0649* (2013.01); *H01L 29/0692* (2013.01); *H01L 29/1095* (2013.01); *H01L 29/4236* (2013.01); *H01L 29/42368* (2013.01)

(58) Field of Classification Search
CPC ............ H01L 29/0649; H01L 29/0692; H01L 29/1095; H01L 29/4236; H01L 29/42368;
(Continued)

(56) References Cited

U.S. PATENT DOCUMENTS 9,515,022 B2 12/2016 Kwon et al.
10,319,627 B2 6/2019 Park et al.
(Continued)

FOREIGN PATENT DOCUMENTS

CN 103390644 A 11/2013
CN 104377202 A 2/2015
(Continued)

OTHER PUBLICATIONS

First Office Action cited in CN202110476539.4, mailed May 7, 2022, 19 pages.
(Continued)

*Primary Examiner* — Theresa T Doan
(74) *Attorney, Agent, or Firm* — Kilpatrick Townsend & Stockton LLP

(57) ABSTRACT

The present disclosure provides a manufacturing method of a semiconductor structure and a semiconductor structure, and relates to the technical field of semiconductors. The manufacturing method includes: providing a base, wherein the base is provided with an active region; forming a gate layer on the base; forming isolation structures on a periphery of the gate layer, wherein in a direction away from the gate layer, each of the isolation structures at least includes a hollow portion and an isolation portion; forming an insulating structure on top surfaces of the isolation structures; forming contact plugs, wherein the contact plugs penetrate the insulating structure; an end of each of the contact plugs close to the base is electrically connected to the active
(Continued)

region; each of the contact plugs is located on a side of each of the isolation structures away from the gate layer.

12 Claims, 12 Drawing Sheets

(51) Int. Cl.
     *H01L 29/10*           (2006.01)
     *H01L 29/423*         (2006.01)
     *H01L 29/76*           (2006.01)

(58) Field of Classification Search
     CPC ............. H01L 29/4925; H01L 29/6653; H01L 29/6656; H01L 29/4991; H01L 29/7833
     USPC ........................................................ 257/401
     See application file for complete search history.

(56) References Cited

U.S. PATENT DOCUMENTS

| | | | |
|---|---|---|---|
| 10,861,953 | B2 | 12/2020 | Chen et al. |
| 10,991,794 | B2 | 4/2021 | Tang et al. |
| 2012/0175707 | A1* | 7/2012 | Jung ................. H01L 27/14603 257/E27.06 |
| 2015/0091089 | A1 | 4/2015 | Niebojewski et al. |
| 2019/0006478 | A1 | 1/2019 | Zhou |
| 2020/0388694 | A1 | 12/2020 | Cheng et al. |
| 2021/0043632 | A1 | 2/2021 | Chang et al. |
| 2021/0098592 | A1* | 4/2021 | Kang ................. H01L 29/66545 |

FOREIGN PATENT DOCUMENTS

| | | |
|---|---|---|
| CN | 105719998 A | 6/2016 |
| CN | 108074866 A | 5/2018 |
| CN | 108231764 A | 6/2018 |
| CN | 109216451 A | 1/2019 |
| CN | 109904120 A | 6/2019 |
| CN | 110416157 A | 11/2019 |
| CN | 210575939 U | 5/2020 |
| CN | 111710607 A | 9/2020 |

OTHER PUBLICATIONS

Second Office Action cited in CN202110476539.4, mailed Jul. 20, 2022, 16 pages.

International Search Report cited in PCT/CN2021/109777, mailed Dec. 28, 2021, 8 pages.

* cited by examiner

MANUFACTURING METHOD OF SEMICONDUCTOR STRUCTURE AND SEMICONDUCTOR STRUCTURE

CROSS-REFERENCE TO RELATED APPLICATIONS

This is a continuation of International Application No. PCT/CN2021/109777, filed on Jul. 30, 2021, which claims the priority to Chinese Patent Application 202110476539.4, titled "MANUFACTURING METHOD OF SEMICONDUCTOR STRUCTURE AND SEMICONDUCTOR STRUCTURE", filed with China National Intellectual Property Administration (CNIPA) on Apr. 29, 2021. The entire contents of International Application No. PCT/CN2021/109777 and Chinese Patent Application 202110476539.4 are incorporated herein by reference.

TECHNICAL FIELD

The present disclosure relates to the technical field of semiconductors, in particular to a manufacturing method of a semiconductor structure and a semiconductor structure.

BACKGROUND

The dynamic random access memory (DRAM) is a semiconductor memory that randomly writes and reads data at high speed and is widely used in data storage devices.

The circuit structure of the DRAM includes a core circuit located in a core region and a peripheral circuit located in a peripheral region. Multiple memory cells are arranged in an array in the core region, and the core circuit is mainly configured to provide a drive current for the multiple memory cells to realize the storage process of the memory cells. The peripheral circuit surrounds the core circuit and is mainly configured to provide the drive current for the core circuit and control the working sequence of the core circuit. The peripheral circuit mainly includes transistors, and the stability of the transistor structure affects the working performance of the peripheral circuit.

However, in the current peripheral circuit, the stability of the transistors is low, which affects the working performance of the peripheral circuit.

SUMMARY

In order to solve at least one problem mentioned in the background, the present disclosure provides a manufacturing method of a semiconductor structure and a semiconductor structure.

In order to achieve the above objective, in a first aspect, the present disclosure provides a manufacturing method of a semiconductor structure. The manufacturing method includes:

providing a base, wherein the base is provided with an active region;

forming a gate layer on the base;

forming isolation structures on a periphery of the gate layer, wherein in a direction away from the gate layer, each of the isolation structures at least includes a hollow portion and an isolation portion;

forming an insulating structure on top surfaces of isolation structures; and forming contact plugs, wherein the contact plugs penetrate the insulating structure; an end of each of the contact plugs close to the base is electrically connected to the active region; each of the contact plugs is located on a side of each of the isolation structures away from the gate layer.

In a second aspect, the present disclosure provides a semiconductor structure. The semiconductor structure includes:

a base, wherein the base is provided with an active region; the active region is provided with a source region, a source low-doped region, a trench region, a drain low-doped region and a drain region that are arranged in sequence;

a gate layer, wherein the gate layer is arranged on the base and corresponds to the trench region of the base; the gate layer includes a first dielectric layer, a gate semi-conductive layer, a gate conductive layer and a second dielectric layer that are stacked in sequence;

isolation structures, wherein the isolation structures are located on a periphery of the gate layer; each of the isolation structures includes a hollow portion and an isolation portion; the hollow portion is located on a side of the isolation portion close to the gate layer;

an insulating structure, the insulating structure being located on a side of the gate layer away from the base; and contact plugs, the contact plugs penetrating the insulating structure and being electrically connected to the active region; each of the contact plugs being located on a side of each of the isolation structures away from the gate layer.

The structure and other objectives and beneficial effects of the present disclosure will be described in detail with reference to the drawings to make the preferred embodiments more obvious and understandable.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description merely show some embodiments of the present disclosure, and those of ordinary skill in the art may still derive other drawings from these drawings without creative efforts.

DETAILED DESCRIPTION

In the actual manufacturing process, the circuit structure of a dynamic random access memory (DRAM) includes a core circuit located in a core region and a peripheral circuit located in a peripheral region. Multiple memory cells are arranged in an array in the core region. Each of the memory cells typically includes a capacitor and a memory transistor. Of the memory transistor, a gate is connected to a word line (WL), a drain is connected to a bit line (BL), and a source is connected to a capacitor. The core region surrounds the periphery of the memory cells arranged in an array, and the core circuit is mainly configured to provide a drive current for the multiple memory cells. The peripheral region surrounds the periphery of the core region. The peripheral circuit is provided with a drive circuit and a clock circuit, etc., which are mainly configured to provide the drive current for the core circuit and control a working sequence of the core circuit, so as to realize the working process of the entire DRAM device. The peripheral circuit mainly includes peripheral transistors, and the stability of the peripheral transistor structure affects the working performance of the peripheral circuit.

Figure 1:
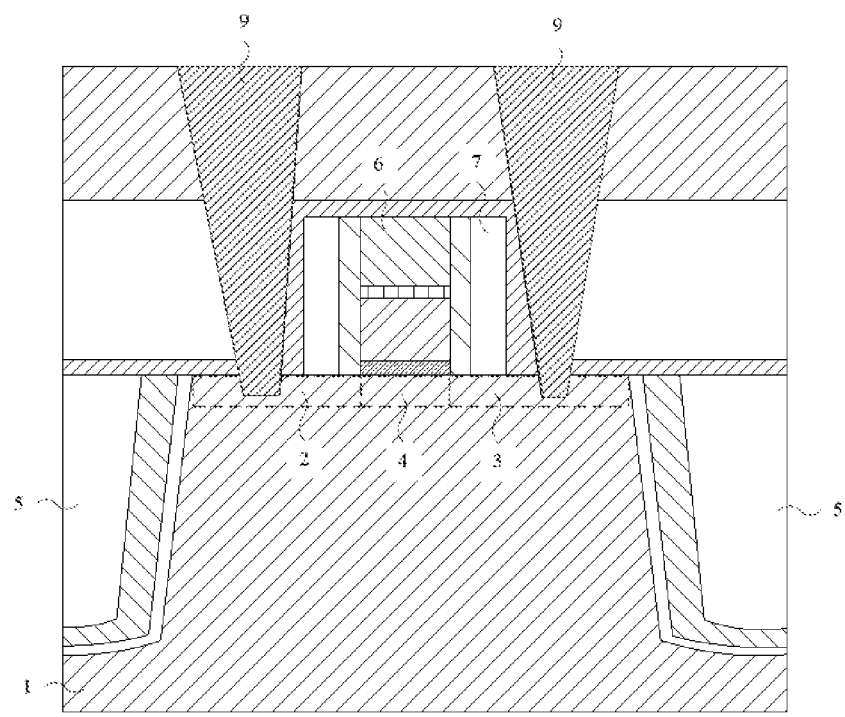
FIG. 1 is a view illustrating a partial structure of a semiconductor structure in the related art.

Referring to FIG. 1, in the related art, the semiconductor structure in the peripheral region generally includes a base 1. The base 1 includes isolation regions 5 and active regions. The isolation regions 5 are spaced apart from each other, and each active region is formed between adjacent isolation regions 5. The active region includes a source region 2, a trench region 4 and a drain region 3. A gate layer 6 is arranged at a position of the base 1 corresponding to the trench region 4, and an insulating structure 8 is arranged above the gate layer 6. Contact plugs 9 pass through the insulating structure 8 and are respectively electrically connected to the source region 2 and the drain region 3 in the base 1. An isolation structure 7 is arranged between each of the contact plugs 9 and the gate layer 6, and the isolation structure 7 is merely an air gap structure.

As the feature size of the semiconductor structure gradually decrease, the distance between the gate layer 6 and the contact plug 9 gradually decrease. Consequently, the electrical isolation effect of the air gap structure is reduced, resulting in electrical contact or electrical signal interference between the gate layer 6 and the contact plug 9, thereby affecting the structural stability and signal transmission process of transistors in the peripheral region. Moreover, since the dielectric constant of air in the air gap structure is small and the distance between the sidewalls of the air gap structure and the contact plug 9 is reduced, the electrical isolation effect between the gate layer 6 and the contact plug 9 is reduced. Further, as the distance between the gate layer 6 and the contact plug 9 is reduced, the air gap structure is likely to cause damage to the structure of the contact plug 9 and affect the signal transmission in the contact plug 9. The above-mentioned problems will all affect the storage performance of the semiconductor structure as a DRAM device.

In view of this, the present disclosure provides a manufacturing method of a semiconductor structure and a semiconductor structure. In the present disclosure, a gate layer is formed on a base, and isolation structures are formed on a periphery of the gate layer to protect the gate layer. Contact plugs are formed on a side of each of the isolation structures away from the gate layer, and an active region and a conductive layer are connected through the contact plug to realize electrical signal transmission between the active region and the conductive layer. Each of the isolation structures includes a hollow portion and an isolation portion. The hollow portion forms an air gap. The hollow portion and the isolation portion jointly isolate the gate layer from the contact plug so as to avoid electrical contact or signal interference between the gate layer and the contact plug. In this way, the present disclosure reduces the feature size of the semiconductor structure, improves the stability of the semiconductor structure, and thereby improves the working performance of the semiconductor structure.

To make the objective, technical solutions and advantages of the present disclosure clearer, the technical solutions in the embodiments of the present disclosure are described in more detail below with reference to the drawings in the preferred embodiments of the present disclosure. The same or similar reference numerals represent the same or similar components or components having the same or similar functions throughout the specification. The described embodiments are some rather than all of the embodiments of the present disclosure. The embodiments described below with reference to the drawings are exemplary, and are merely intended to explain the present disclosure, rather than to limit the present disclosure. All other embodiments obtained by those of ordinary skill in the art based on the embodiments of the present disclosure without creative efforts should fall within the protection scope of the present disclosure. The embodiments of the present disclosure are described in detail below with reference to the drawings.

Referring to FIGS. 2 to 8 and FIGS. 9 to 24, an embodiment of the present disclosure provides a manufacturing method of a semiconductor structure. The manufacturing method includes:

S1: Provide a base, where the base 10 is provided with active regions. The step of providing the base 10 may include:

S11: Form the active regions and isolation regions in the base.

S12: Form a source region, a source low-doped region, a trench region, a drain low-doped region and a drain region that are arranged in sequence in each of the active region.

Figure 2:
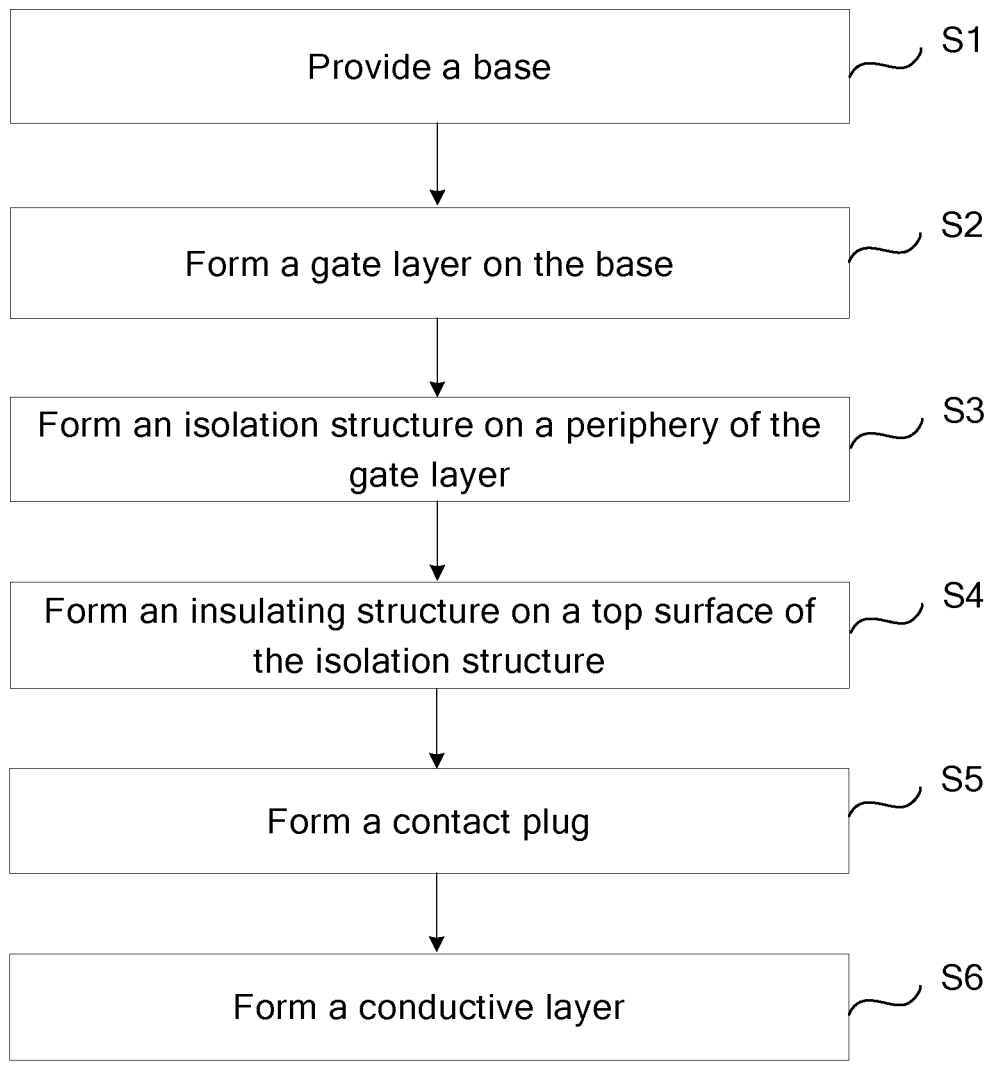
FIG. 2 is a flowchart of a manufacturing method of a semiconductor structure according to an embodiment of the present disclosure.
Figure 3:
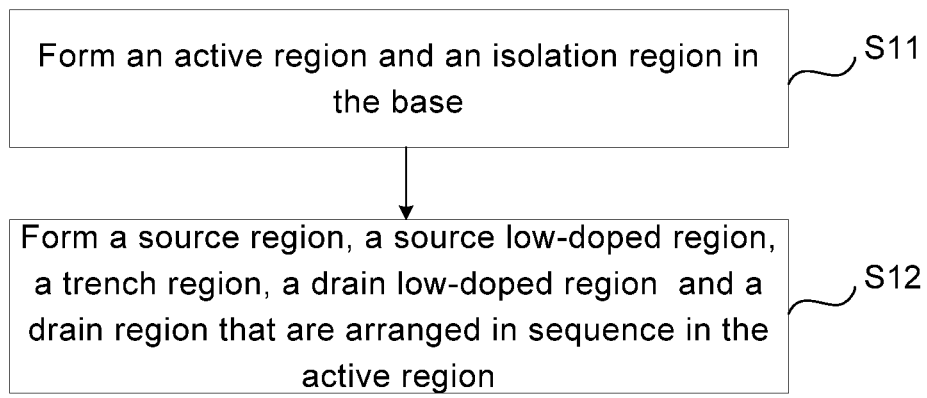
FIG. 3 is a flowchart of providing a base by the manufacturing method of a semiconductor structure according to an embodiment of the present disclosure.
Figure 9:
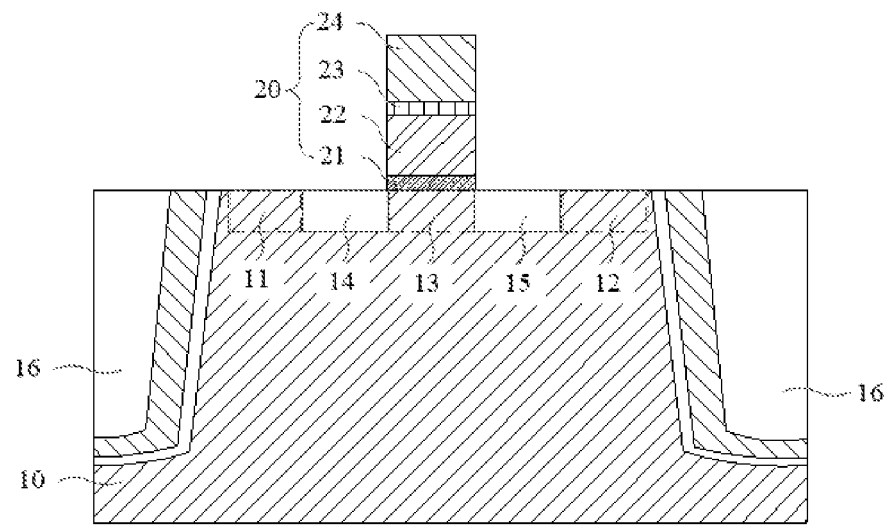
FIG. 9 is a view illustrating the base and the gate layer of the semiconductor structure according to an embodiment of the present disclosure.

It should be noted that, referring to FIG. 2, FIG. 3 and FIG. 9, the material of the base 10 may be monocrystalline silicon, polysilicon, amorphous silicon, silicon-germanium, silicon-on-insulator (SOI), or other material known to those skilled in the art. The base 10 provides a supporting foundation for structural layers on the base 10. In this embodiment, the base 10 includes a Si substrate. The base 10 may be provided with a semi-conductive layer. The semi-conductive layer forms the active region of the base 10. Each of the active regions includes a source region 11 and a drain region 12, and a trench region 13 is formed between the source region 11 and the drain region 12. Each isolation region 16 is provided between adjacent active regions. A shallow trench isolation structure (STI) may be provided in the isolation region 16 to isolate the adjacent active regions.

In this embodiment, a source low-doped region 14 is arranged between the source region 11 and the trench region 13, and a drain low-doped region 15 is arranged between the drain region 12 and the trench region 13. The source low-doped region 14 can effectively weaken an electric field of the source region 11, thereby alleviating the degradation of the source region 11 induced by hot electrons. Similarly, the drain low-doped region 15 can effectively weaken an electric field of the drain region 12, thereby alleviating the degradation of the drain region 12 induced by hot electrons. Therefore, the source low-doped region 14 and the drain low-doped region 15 can effectively reduce the leakage current between the source region 11 and the drain region 12, so as to ensure the stability of the transistor structure.

It should be pointed out that in this embodiment, the active region may be located on the base 10 in the peripheral region, thereby forming a transistor structure in the peripheral region. Of course, in the actual manufacturing process, the active region may also be located in a core region or an array region, thereby forming a transistor in the core region or a transistor in the array region, which is not limited in this embodiment.

Figure 4:
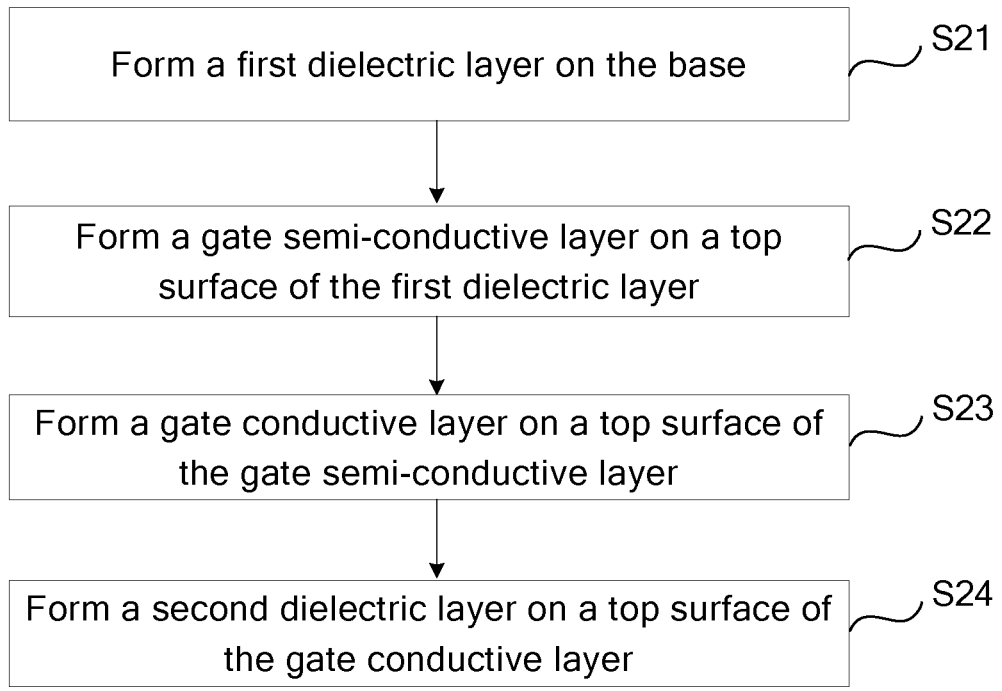
FIG. 4 is a flowchart of forming a gate layer by the manufacturing method of a semiconductor structure according to an embodiment of the present disclosure.

Referring to FIGS. 4 and 9, after the base 10 is formed, the manufacturing method further includes S2: form a gate layer on the base. The step of forming the gate layer 20 may include:

S21: Form a first dielectric layer on the base, wherein the first dielectric layer 21 is provided opposite to the trench region 13. The first dielectric layer 21 may be an oxide layer, for example, a silicon oxide layer. The main function of the first dielectric layer 21 is to isolate the trench region 13 and subsequently formed structural layers of the gate layer 20 and provide a structural foundation for the subsequently formed structural layers of the gate layer 20. The subsequently formed structural layers of the gate layer 20 may include, but are not limited to, a gate semi-conductive layer 22, a gate conductive layer 23 and a second dielectric layer 24, which will be described below.

S22: Form the gate semi-conductive layer on a top surface of the first dielectric layer. The gate semi-conductive layer 22 may be a polysilicon layer.

S23: Form the gate conductive layer on a top surface of the gate semi-conductive layer. The gate conductive layer 23 may be a titanium nitride layer.

S24: Form the second dielectric layer on a top surface of the gate conductive layer. The second dielectric layer 24 may be a silicon nitride layer. The main function of the second dielectric layer 24 is to isolate the gate conductive layer 23 from other conductive layer on the second dielectric layer 24, so as to ensure a stable structure of the gate layer 20.

Figure 5:
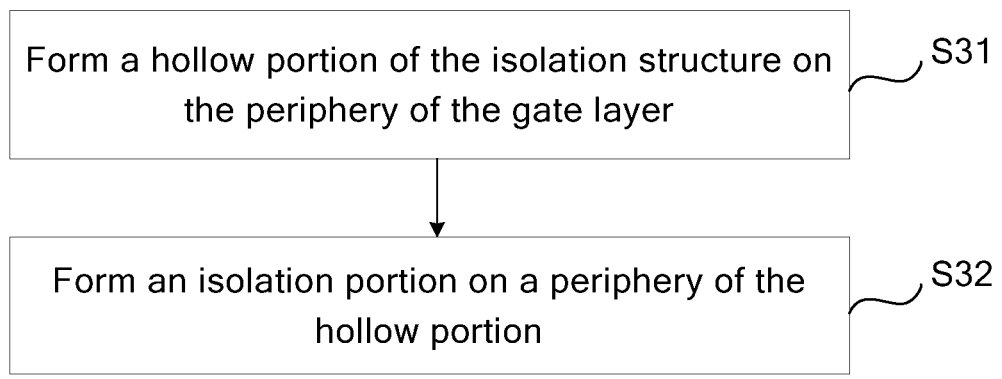
FIG. 5 is a flowchart of forming an isolation structure by the manufacturing method of a semiconductor structure according to an embodiment of the present disclosure.
Figure 6:
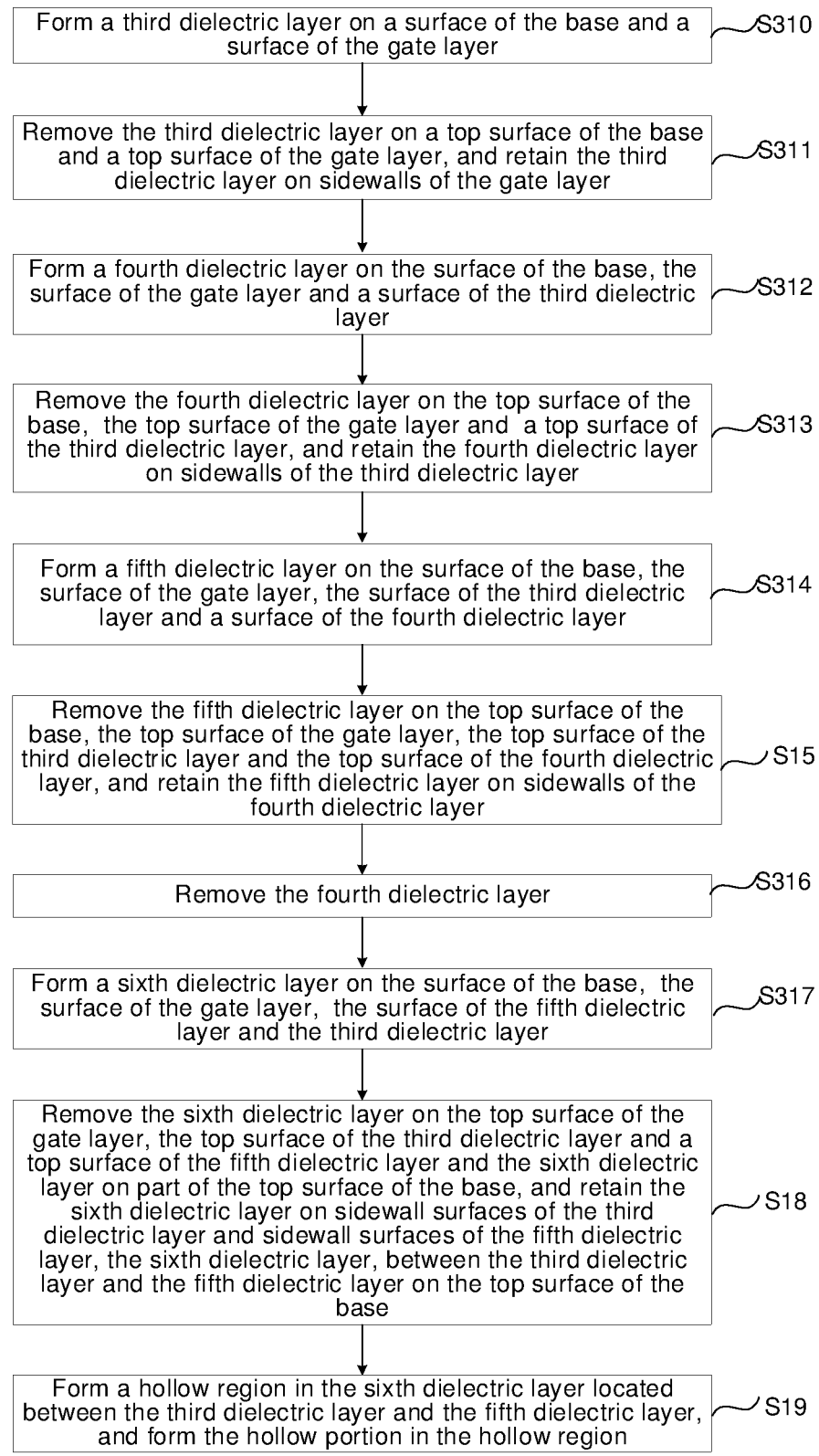
FIG. 6 is a flowchart of forming a hollow portion by the manufacturing method of a semiconductor structure according to an embodiment of the present disclosure.

Referring to FIG. 5, the isolation structures 30 provided in this embodiment may be formed as follows:

S3: Form the isolation structures on a periphery of the gate layer, where in a direction away from the gate layer 20, each of the isolation structures 30 at least includes a hollow portion 31 and an isolation portion 32.

The step of forming the isolation structures 30 may include:

S31: Form the hollow portion of each of the isolation structures on the periphery of the gate layer.

S32: Form the isolation portion on a periphery of the hollow portion.

It should be noted that, in this embodiment, the isolation structure 30 includes the hollow portion 31 and the isolation portion 32. The hollow portion 31 forms an air gap structure, which can reduce the parasitic capacitance in the transistor structure. Meanwhile, the isolation portion 32 is located on the periphery of the hollow portion 31 and on a side of the hollow portion 31 away from the gate layer 20. Therefore, the isolation portion 32 can effectively protect a subsequently formed contact plug 50. In the context that the feature size of the semiconductor structure is continuously shrinking, the isolation portion can prevent the air gap structure of the hollow portion 31 from damaging the contact plug 50, thereby ensuring the integrity of the semiconductor structure.

Further, the isolation portion 32 can effectively improve the electrical isolation effect of the isolation structure 30. In the context that the feature size of the semiconductor structure is continuously shrinking, the isolation portion can prevent electrical contact or signal interference from occurring between the gate layer 20 and the contact plug 50, thereby improving the stability of electrical isolation between the gate layer and the contact plug.

Figure 10:
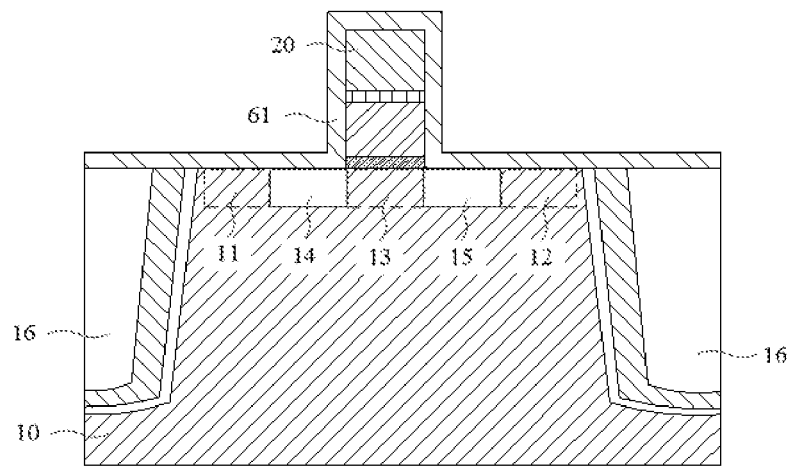
FIG. 10 is a view illustrating a structure obtained by forming a third dielectric layer of the semiconductor structure according to an embodiment of the present disclosure.

Referring to FIG. 6 and FIGS. 10 to 18, the step of forming the hollow portion 31 may include:

S310: Form a third dielectric layer on a surface of the base and a surface of the gate layer. Referring to FIG. 10, the third dielectric layer 61 covers a top surface of the base 10 and a top surface of the gate layer 20 and sidewall surfaces of the gate layer 20. The material of the third dielectric layer 61 may include silicon nitride.

Figure 11:
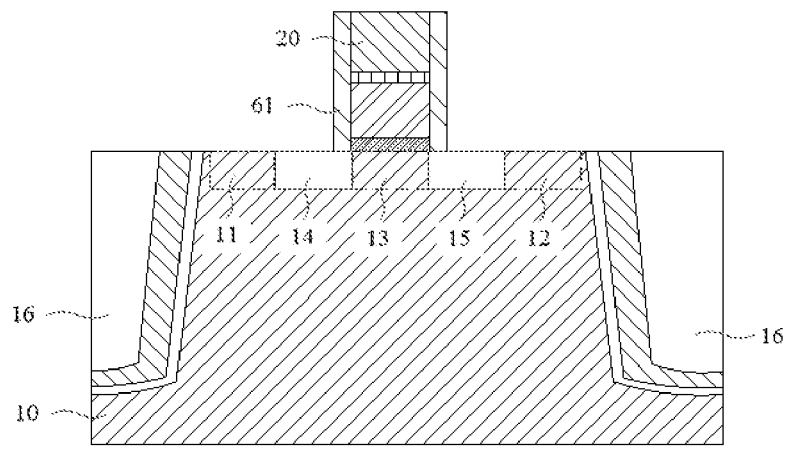
FIG. 11 is a view illustrating a structure obtained by removing part of the third dielectric layer of the semiconductor structure according to an embodiment of the present disclosure.

S311: Remove the third dielectric layer on the top surface of the base and a top surface of the gate layer, and retain the third dielectric layer on sidewalls of the gate layer. Referring to FIG. 11, after the third dielectric layer 61 is removed, the top surface of the base 10 and the top surface of the gate layer 20 are exposed.

Figure 12:
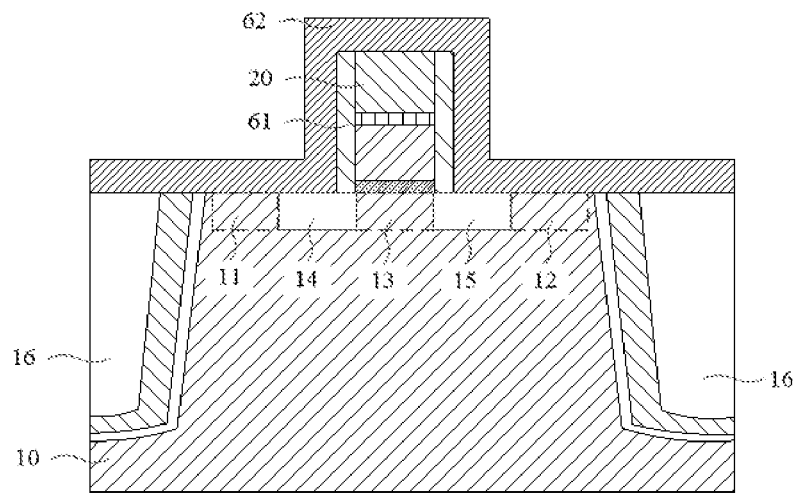
FIG. 12 is a view illustrating a structure obtained by forming a fourth dielectric layer of the semiconductor structure according to an embodiment of the present disclosure.

S312: Form a fourth dielectric layer on the surface of the base, the surface of the gate layer and a surface of the third dielectric layer. Referring to FIG. 12, the fourth dielectric layer 62 may cover the top surface of the base 10, the top surface of the gate layer 20 and a top surface of the third dielectric layer 61, and may also cover sidewall surfaces of the third dielectric layer 61. The fourth dielectric layer 62 may be an oxide layer.

Figure 13:
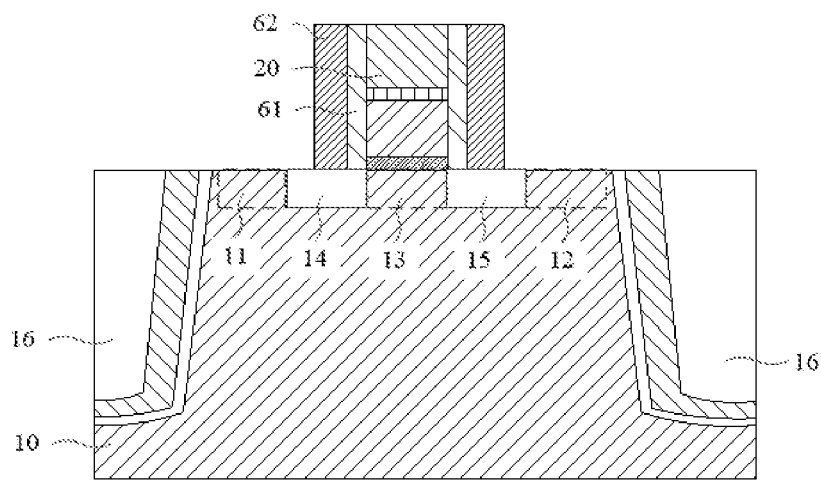
FIG. 13 is a view illustrating a structure obtained by removing part of the fourth dielectric layer of the semiconductor structure according to an embodiment of the present disclosure.

S313: Remove the fourth dielectric layer on the top surface of the base, the top surface of the gate layer and the top surface of the third dielectric layer, and retain the fourth dielectric layer on sidewalls of the third dielectric layer. Referring to FIG. 13, after the fourth dielectric layer 62 is removed, the top surface of the base 10, the top surface of the gate layer 20 and the top surface of the third dielectric layer 61 are all exposed.

Figure 14:
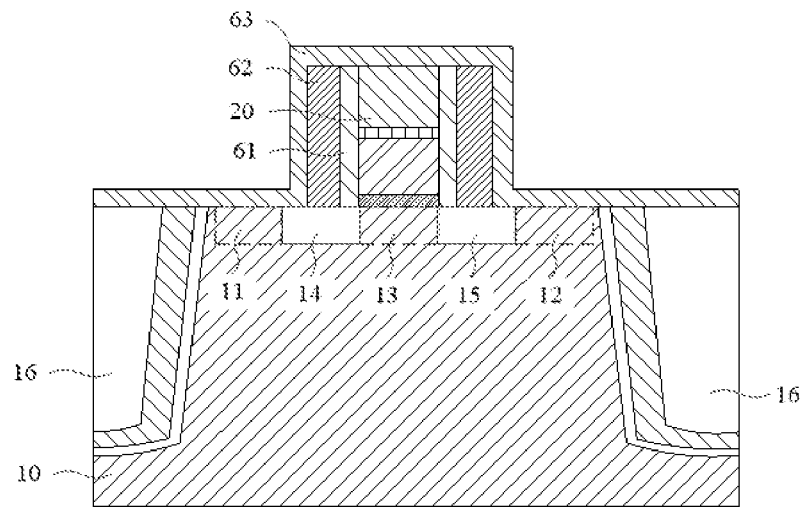
FIG. 14 is a view illustrating a structure obtained by forming a fifth dielectric layer of the semiconductor structure according to an embodiment of the present disclosure.

S314: Form a fifth dielectric layer on the surface of the base, the surface of the gate layer, the surface of the third dielectric layer and a surface of the fourth dielectric layer. Referring to FIG. 14, the fifth dielectric layer 63 may cover the top surface of the base 10, the top surface of the gate layer 20, the top surface of the third dielectric layer 61 and a top surface of the fourth dielectric layer 62, and may also cover sidewall surfaces of the fourth dielectric layer 62.

Figure 15:
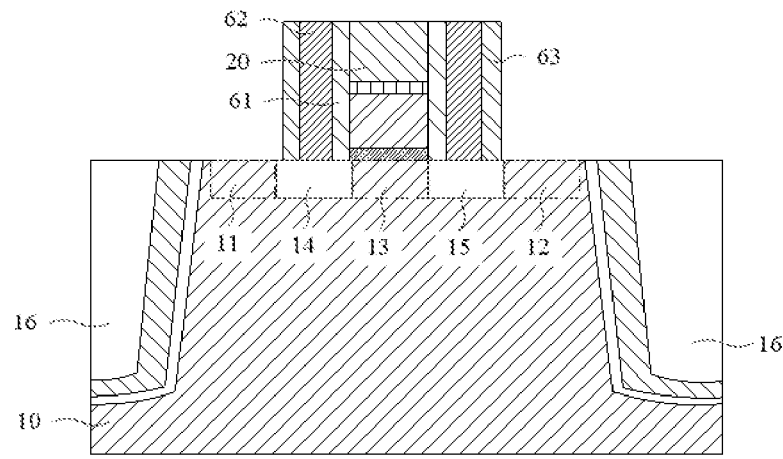
FIG. 15 is a view illustrating a structure obtained by removing part of the fifth dielectric layer of the semiconductor structure according to an embodiment of the present disclosure.

S315: Remove the fifth dielectric layer on the top surface of the base, the top surface of the gate layer, the top surface of the third dielectric layer and the top surface of the fourth dielectric layer, and retain the fifth dielectric layer on sidewalls of the fourth dielectric layer. Referring to FIG. 15, after the fifth dielectric layer 63 is removed, the top surface of the base 10, the top surface of the gate layer 20, the top surface of the third dielectric layer 61 and the top surface of the fourth dielectric layer 62 are all exposed.

Figure 16:
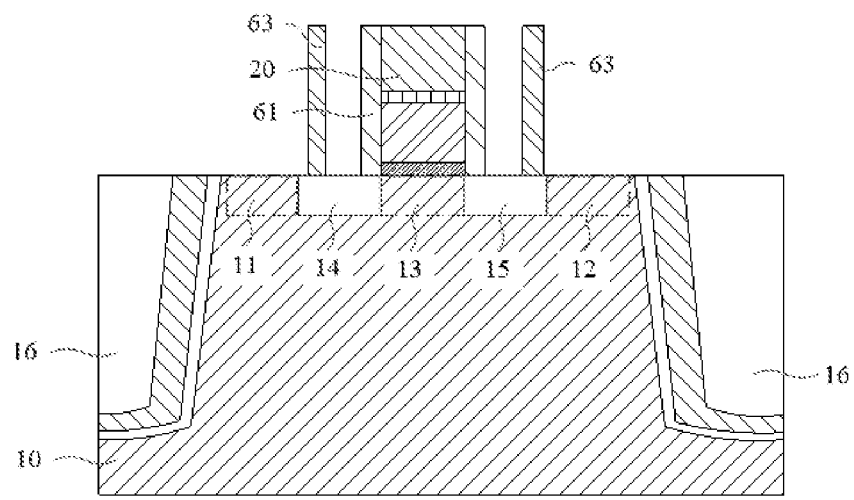
FIG. 16 is a view illustrating a structure obtained by removing the fourth dielectric layer of the semiconductor structure according to an embodiment of the present disclosure.

S316: Remove the fourth dielectric layer. Referring to FIG. 16, the fourth dielectric layer 62 located between the third dielectric layer 61 and the fifth dielectric layer 63 is removed by selective etching, so as to form trenches to be filled between the third dielectric layer 61 and the fifth dielectric layer 63.

Figure 17:
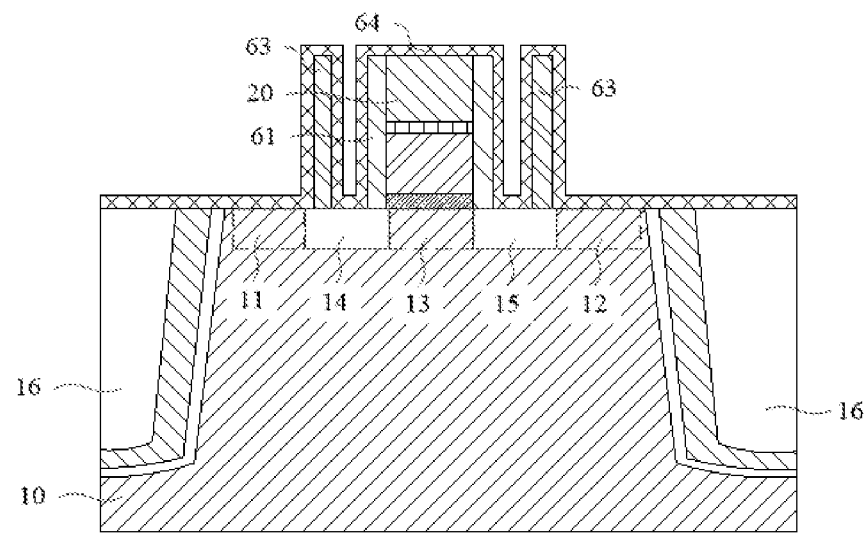
FIG. 17 is a view illustrating a structure obtained by forming a sixth dielectric layer of the semiconductor structure according to an embodiment of the present disclosure.

S317: Form a sixth dielectric layer on the surface of the base, the surface of the gate layer, the surface of the fifth dielectric layer and the surface of the third dielectric layer. Referring to FIG. 17, the sixth dielectric layer 64 covers the top surface of the base 10, the top surface of the gate layer 20, the top surface of the fifth dielectric layer 63 and the top surface of the third dielectric layer 61, and also covers sidewall surfaces of the third dielectric layer 61 and sidewall surfaces the fifth dielectric layer 63.

In addition, the sixth dielectric layer 64 fills the trenches to be filled.

Figure 18:
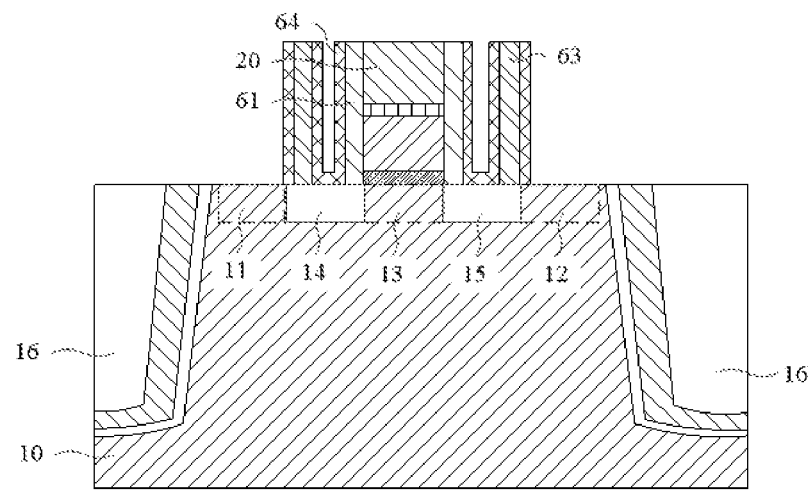
FIG. 18 is a view illustrating a structure obtained by removing part of the sixth dielectric layer of the semiconductor structure according to an embodiment of the present disclosure.

S318: Remove the sixth dielectric layer on the top surface of the gate layer, the top surface of the third dielectric layer and the top surface of the fifth dielectric layer and the sixth dielectric layer on part of the top surface of the base, and retain the sixth dielectric layer on the sidewall surfaces of the third dielectric layer and sidewall surfaces of the fifth dielectric layer, the sixth dielectric layer between the third dielectric layer and the fifth dielectric layer on the top surface of the base. The structure obtained by this step is shown in FIG. 18.

S319: Form a hollow region in the sixth dielectric layer located between the third dielectric layer and the fifth dielectric layer, and form a hollow portion in the hollow region. In FIG. 18, the hollow region is located between the third dielectric layer 61 and the fifth dielectric layer 63, which is not filled with any structure and can form an air gap structure. The air gap structure can effectively reduce the parasitic capacitance in the transistor structure, thereby reducing the delay in the switching process of the transistor structure and preventing the threshold voltage of the transistor structure from drifting.

Figure 7:
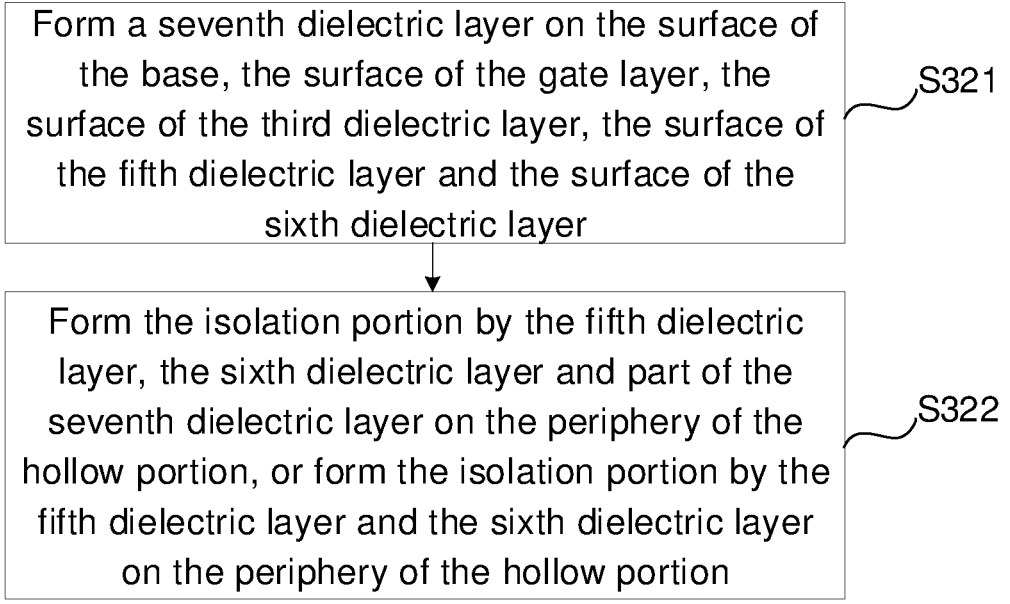
FIG. 7 is a flowchart of forming an isolation portion by the manufacturing method of a semiconductor structure according to an embodiment of the present disclosure.
Figure 8:
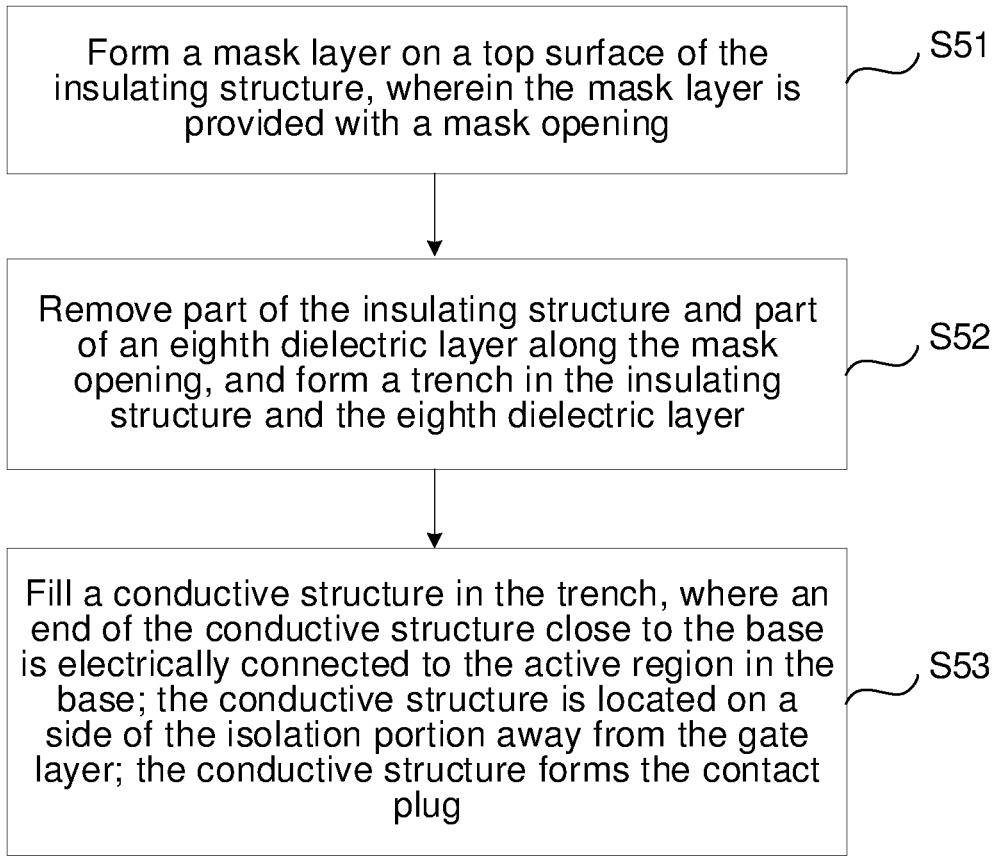
FIG. 8 is a flowchart of forming a contact plug by the manufacturing method of a semiconductor structure according to an embodiment of the present disclosure.
Figure 19:
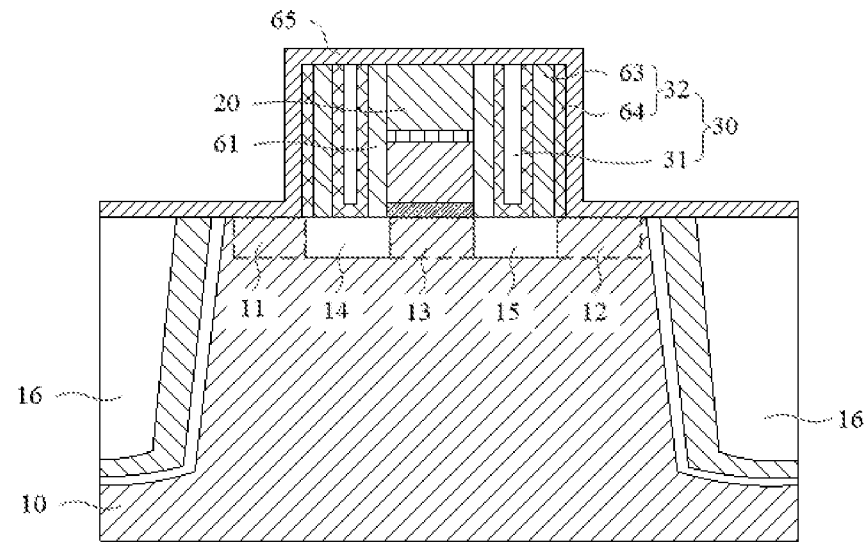
FIG. 19 is a view illustrating a structure obtained by forming a seventh dielectric layer of the semiconductor structure according to an embodiment of the present disclosure.

Referring to FIGS. 7 and 19, after the hollow portion 31 is formed, the manufacturing method may further form the isolation portion 32 on the periphery of the hollow portion 31, which may specifically include the following steps:

S321: Form a seventh dielectric layer on the surface of the base, the surface of the gate layer, the surface of the third dielectric layer, the surface of the fifth dielectric layer and the surface of the sixth dielectric layer. Referring to FIG. 19, the seventh dielectric layer 65 only covers the top surface of the base 10, the top surface of the gate layer 20, the top surface of the third dielectric layer 61, the top surface of the fifth dielectric layer 63 and the top surface of the sixth dielectric layer 64, and is not filled in the hollow portion 31.

S322: Form the isolation portion by the fifth dielectric layer, the sixth dielectric layer and part of the seventh dielectric layer on the periphery of the hollow portion, or form the isolation portion by the fifth dielectric layer and the sixth dielectric layer on the periphery of the hollow portion.

It should be noted that the fifth dielectric layer 63 and the seventh dielectric layer 65 may be made of the same material, which includes silicon nitride. The sixth dielectric layer 64 may be made of a material, which includes an oxide.

In a first feasible implementation, the isolation portion 32 may be formed by the fifth dielectric layer 63, the sixth dielectric layer 64 and part of the seventh dielectric layer 65. In this case, the isolation portion 32 formed is a nitride-oxide-nitride (NON) isolation portion 32. In a second feasible implementation, the isolation portion 32 may be formed by the fifth dielectric layer 63 and the sixth dielectric layer 64. In this case, the isolation portion 32 formed is an oxide-nitride-oxide (ONO) isolation portion 32. By stacking the oxide and the nitride together to form the isolation portion 32, the electrical isolation effect of the isolation portion 32 is improved.

Figure 20:
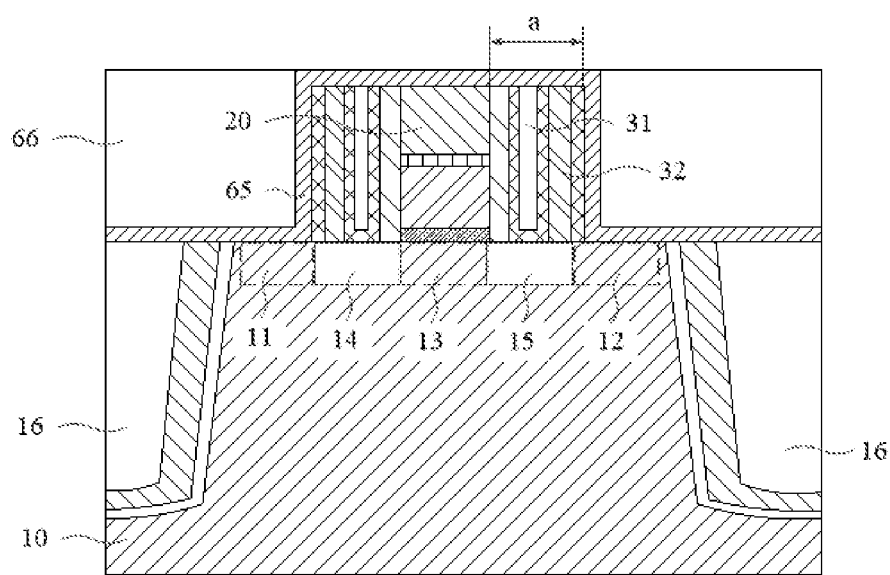
FIG. 20 is a view illustrating a structure obtained by forming an eighth dielectric layer of the semiconductor structure according to an embodiment of the present disclosure.

After the isolation structure 30 is formed, referring to FIG. 20, the manufacturing method further includes: form an eighth dielectric layer 66 on a surface of the seventh dielectric layer 65. It should be noted that the eighth dielectric layer 66 may include an oxide layer. A top surface of the eighth dielectric layer 66 is flush with a top surface of the seventh dielectric layer 65, and part of the top surface of the seventh dielectric layer 65 is exposed. It should be pointed out that the top surface of the seventh dielectric layer 65 here specifically refers to a part located above the gate layer 20, rather than that located on the base 10.

Figure 21:
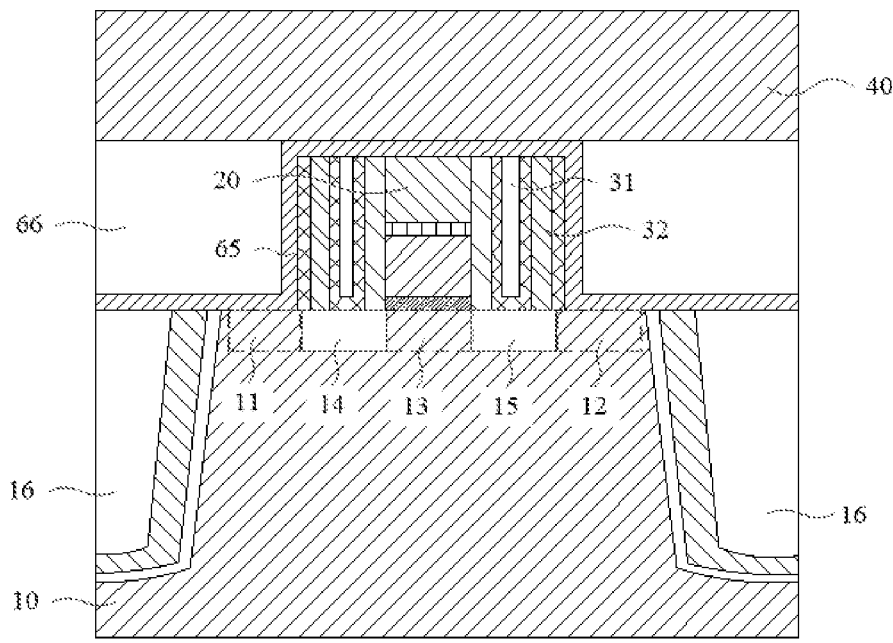
FIG. 21 is a view illustrating a structure obtained by forming an insulating structure of the semiconductor structure according to an embodiment of the present disclosure.
Figure 22:
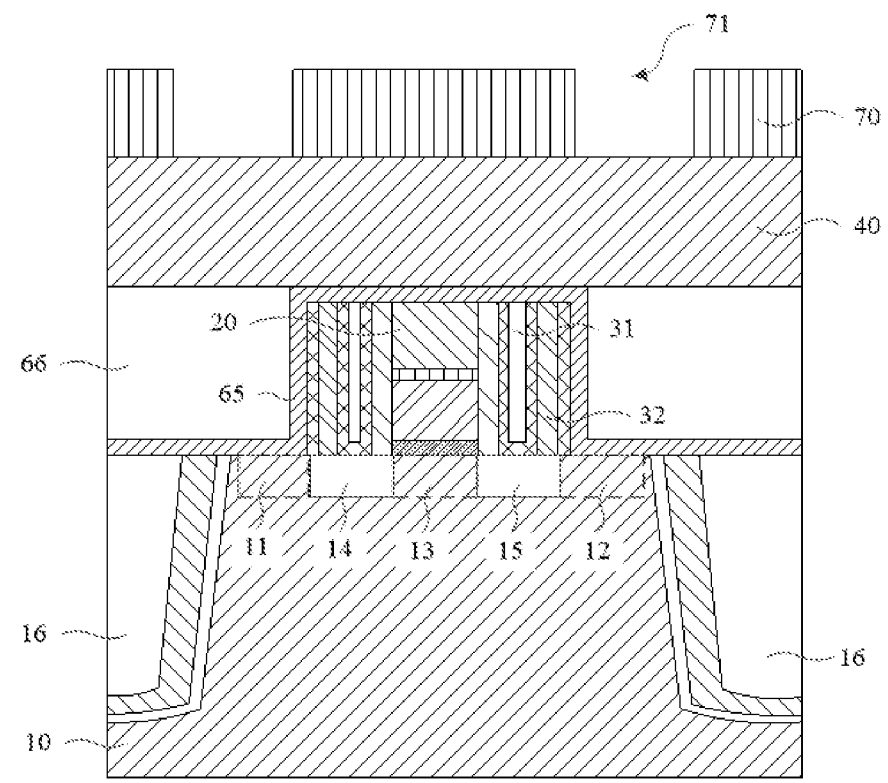
FIG. 22 is a view illustrating a structure obtained by forming a mask layer of the semiconductor structure according to an embodiment of the present disclosure.
Figure 23:
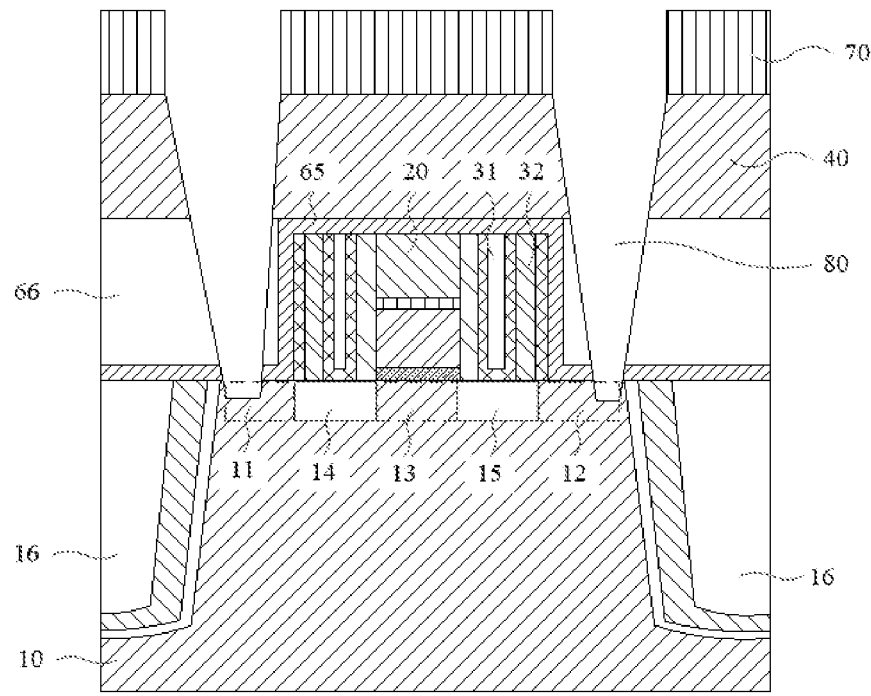
FIG. 23 is a view illustrating a structure obtained by forming a trench of the semiconductor structure according to an embodiment of the present disclosure.

After the isolation structure 30 is formed, referring to FIG. 21, the manufacturing method may further include:

S4: Form an insulating structure on a top surface of each of the isolation structures. The material of the insulating structure 40 may include silicon nitride, and the insulating structure mainly functions to isolate the gate layer 20 from a conductive layer above the insulating structure 40.

S5: Form contact plugs, wherein the contact plugs 50 penetrate the insulating structure 40; an end of each of the contact plugs 50 close to the base 10 is electrically connected to the active region; each of the contact plugs 50 is located on a side of the isolation structure 30 away from the gate layer 20. It should be noted that, referring to FIG. 8 and FIGS. 22 to 24, the step of forming the contact plugs 50 may include:

S51: Form a mask layer on a top surface of the insulating structure, wherein the mask layer is provided with mask openings.

S52: Remove part of the insulating structure and part of the eighth dielectric layer along the mask openings, and form trenches in the insulating structure and the eighth dielectric layer.

S53: Fill a conductive structure in each of the trenches, wherein an end of the conductive structure close to the base is electrically connected to the active region in the base; the conductive structure is located on a side of the isolation portion away from the gate layer; the conductive structure forms the contact plug.

It should be noted that the mask openings 71 of the mask layer 70 correspond to the positions of the trenches 80, and the positions of the trenches 80 correspond to the positions of the contact plugs 50 to be formed. The contact plugs 50 can connect a source formed in the source region 11 and a drain formed in the drain region 12 to different conductive layers, respectively. When an electrical signal is applied to the gate layer 20, if the trench region 13 is turned on, the electrical signal can be input into the source, and the electrical signal can be output from the drain, thereby realizing a transistor function.

There is electrical signal transmission in the contact plug 50. Therefore, if the distance between the contact plug 50 and the gate layer 20 is too small, the isolation structure 30 will be electrically broken down, resulting in electrical contact or electrical signal interference between the contact plug and the gate layer. Therefore, in this embodiment, the isolation structure 30 is composed of the hollow portion 31 and the isolation portion 32, which effectively solves the above-mentioned problem and ensures the stability of the semiconductor structure in the context that the feature size of the semiconductor structure decreases.

S6: Form the conductive layer, wherein the conductive layer is electrically connected to an end of each of the contact plugs 50 away from the base 10. It should be noted that there may be multiple conductive layers (not shown in the figure), and the different conductive layers may be respectively connected to the source or the drain through the different contact plugs 50.

Referring to FIG. 20, in the direction away from the gate layer 20, the thickness of the isolation structure 30 is 15-40 nm. The thickness may be that indicated by a in FIG. 20. It should be noted that since the isolation structure 30 in this embodiment includes the hollow portion 31 and the isolation portion 32, the thickness of the isolation structure 30 is increased. This can increase the distance between the contact plug 50 and the gate layer 20, thereby improving the electrical isolation effect of the isolation structure 30.

If the thickness of the isolation structure 30 is too small, the above-mentioned electrical isolation effect cannot be guaranteed. If the thickness of the isolation structure 30 is too large, the feature size of the semiconductor structure will be increased. Therefore, in actual use, a user may adjust the thickness of the isolation structure 30 within the above range as required, for example, it may be 20 nm, 30 nm or 35 nm. The specific value of the thickness is not limited in this embodiment.

Figure 24:
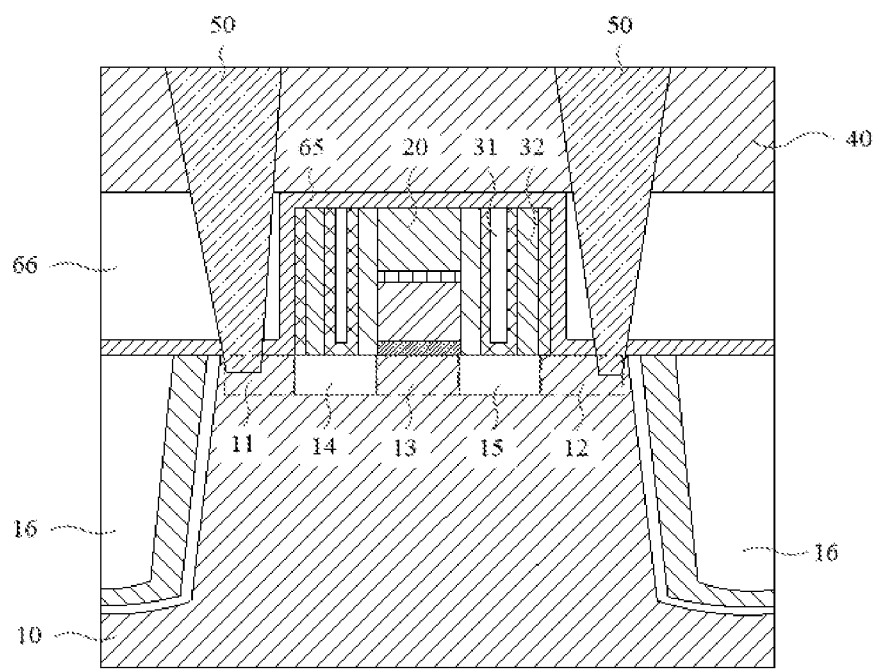
FIG. 24 is a view illustrating a structure obtained by forming a contact plug of the semiconductor structure according to an embodiment of the present disclosure.

Further, referring to FIG. 24, in this embodiment, a projection of the isolation structure 30 close to a side of the source region 11 on the base 10 is located in the source low-doped region 14 or overlaps with the source low-doped region 14.

A projection of the isolation structure 30 close to a side of the drain region 12 on the base 10 is located in the drain low-doped region 15 or overlaps with the drain low-doped region 15.

It should be noted that since the thickness of the isolation structure 30 is increased, the thickness or area of the source low-doped region 14 and the drain low-doped region 15 located at the bottom of the isolation structure 30 may also be increased accordingly, so as to effectively reduce the leakage current between the source region 11 and the drain region 12. The thickness of the source low-doped region 14 and the drain low-doped region 15 may be 10-40 nm, and specifically may be 15 nm, 20 nm, 30 nm or 35 nm, which is not limited in this embodiment.

In a feasible implementation, the material of the conductive structure includes tungsten. It should be noted that tungsten has a high melting point and desirable thermal shock resistance, so the stability of the structure of the contact plug 50 can be ensured, thereby ensuring the reliability of electrical signal transmission.

Further, referring to FIG. 24, on the basis of the above embodiments, the present disclosure further provides a semiconductor structure. The semiconductor structure includes:

a base 10, wherein the base 10 is provided with an active region; the active region is sequentially provided with a source region 11, a source low-doped region 14, a trench region 13, a drain low-doped region 15 and a drain region 12;

a gate layer 20, wherein the gate layer 20 is arranged on the base 10 and corresponds to the trench region 13 of the base 10; the gate layer 20 includes a first dielectric layer 21, a gate semi-conductive layer 22, a gate conductive layer 23 and a second dielectric layer 24 that are stacked in sequence;

isolation structures 30, wherein the isolation structures 30 are located on a periphery of the gate layer 20; each of the isolation structures 30 includes a hollow portion 31 and an isolation portion 32; the hollow portion 31 is located on a side of the isolation portion 32 close to the gate layer 20;

an insulating structure 40, wherein the insulating structure 40 is located on a side of the gate layer 20 away from the base 10;

a conductive layer, wherein the conductive layer is located on a side of the insulating structure 40 away from the base 10; and contact plugs 50, wherein the contact plugs 50 penetrate the insulating structure 40, and are electrically connected to the conductive layer and the active region; each of the contact plugs 50 is located on a side of each of the isolation structures 30 away from the gate layer 20.

It should be noted that the above-mentioned semiconductor structure may be a transistor structure in a peripheral region of a DRAM device. The gate layer 20 is formed on the base 10, and the isolation structures 30 are formed on the periphery of the gate layer 20 to protect the gate layer 20. Each of the contact plugs 50 is formed on the side of each of the isolation structures 30 away from the gate layer 20, and the active region and the conductive layer are connected through the contact plugs 50 to realize electrical signal transmission between the active region and the conductive layer.

Each of the isolation structures 30 includes a hollow portion 31 and an isolation portion 32. The hollow portion 31 forms an air gap. The hollow portion 31 and the isolation portion 32 jointly isolate the gate layer 20 and the contact plug 50 so as to avoid electrical contact or signal interference between the gate layer and the contact plug. In this way, the present disclosure reduces the feature size of the semiconductor structure, improves the stability of the semiconductor structure, and thereby improves the working performance of the semiconductor structure.

The other structures and technical effects are described above, and will not be repeated here.

In the above description, unless otherwise clearly specified, the terms such as "mounting", "interconnection", and "connection" are intended to be understood in a broad sense. For example, the "connection" may be a fixed connection, an indirect connection via a medium, or a communication or interaction between two elements. Those of ordinary skill in the art may understand the specific meanings of the above terms in the present disclosure based on the specific situation. The terms such as "upper", "lower", "front", "rear", "vertical", "horizontal", "top", "bottom", "inside" and "outside" indicate the orientation or position relationships based the drawings. They are merely intended to facilitate and simplify the description of the present disclosure, rather than to indicate or imply that the mentioned device or components must have a specific orientation or must be constructed and operated in a specific orientation. Therefore, these terms should not be construed as a limitation to the present disclosure. In the description of the present disclosure, "multiple" means two or more, unless otherwise specifically defined.

The terms "first", "second", "third" and "fourth" (if any) in the description and claims of present disclosure and in the above drawings are intended to distinguish between similar objects without necessarily indicating a specific order or sequence. It should be understood that the data used in such a way may be exchanged under proper conditions, such that the described embodiments of the present disclosure may be implemented in a sequence other than those illustrated or described herein, for example. Moreover, the terms "include", "comprise", and any other variants mean to cover the non-exclusive inclusion, for example, a process, method, system, product, or device that includes a list of steps or units is not necessarily limited to those steps or units which are clearly listed, but may include other steps or units which are not expressly listed or inherent to such a process, method, system, product, or device.

Finally, it should be noted that the above embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present disclosure.

The invention claimed is:

1. A manufacturing method of a semiconductor structure, comprising:
   providing a base, wherein the base is provided with an active region;
   forming a gate layer on the base;
   forming isolation structures on a periphery of the gate layer, wherein in a direction away from the gate layer, each of the isolation structures at least comprises a hollow portion and an isolation portion;
   forming an insulating structure on top surfaces of the isolation structures; and
   forming contact plugs, wherein the contact plugs penetrate the insulating structure; an end of each of the contact plugs close to the base is electrically connected to the active region; each of the contact plugs is located on a side of each of the isolation structures away from the gate layer;
   wherein the forming the isolation structures on the periphery of the gate layer comprises:
      forming a third dielectric layer on a surface of the base and a surface of the gate layer;
      removing the third dielectric layer on a top surface of the base and a top surface of the gate layer, and retaining the third dielectric layer on sidewalls of the gate layer;
      forming a fourth dielectric layer on the surface of the base, the surface of the gate layer and a surface of the third dielectric layer;
      removing the fourth dielectric layer on the top surface of the base, the top surface of the gate layer and a top surface of the third dielectric layer, and retaining the fourth dielectric layer on sidewalls of the third dielectric layer;
      forming a fifth dielectric layer on the surface of the base, the surface of the gate layer, the surface of the third dielectric layer and a surface of the fourth dielectric layer;
      removing the fifth dielectric layer on the top surface of the base, the top surface of the gate layer, the surface of the third dielectric layer and the surface of the fourth dielectric layer, and retaining the fifth dielectric layer on sidewalls of the fourth dielectric layer;
      removing the fourth dielectric layer;
      forming a sixth dielectric layer on the surface of the base, the surface of the gate layer, a surface of the fifth dielectric layer and the surface of the third dielectric layer;
      removing the sixth dielectric layer on the top surface of the gate layer, the top surface of the third dielectric layer and a top surface of the fifth dielectric layer and the sixth dielectric layer on part of the top surface of the base, and retaining the sixth dielectric layer on sidewall surfaces of the third dielectric layer and sidewall surfaces of the fifth dielectric layer, the sixth dielectric layer, between the third dielectric layer and the fifth dielectric layer, on the top surface of the base;
      forming a hollow region in the sixth dielectric layer located between the third dielectric layer and the fifth dielectric layer, and forming the hollow portion in the hollow region; and
      forming the isolation portion on a periphery of the hollow portion.

2. The manufacturing method of the semiconductor structure according to claim 1, wherein the providing the base comprises:
   forming the active region and an isolation region in the base; and
   forming a source region, a source low-doped region, a trench region, a drain low-doped region and a drain region that are arranged in sequence in the active region.

3. The manufacturing method of the semiconductor structure according to claim 2, wherein the forming the gate layer on the base comprises:
  forming a first dielectric layer on the base, wherein the first dielectric layer is provided opposite to the trench region;
  forming a gate semi-conductive layer on a top surface of the first dielectric layer;
  forming a gate conductive layer on a top surface of the gate semi-conductive layer; and
  forming a second dielectric layer on a top surface of the gate conductive layer.

4. The manufacturing method of the semiconductor structure according to claim 1, wherein the forming the isolation portion on the periphery of the hollow portion comprises:
  forming a seventh dielectric layer on the surface of the base, the surface of the gate layer, the surface of the third dielectric layer, the surface of the fifth dielectric layer and the surface of the sixth dielectric layer; and
  forming the isolation portion by the fifth dielectric layer, the sixth dielectric layer and part of the seventh dielectric layer on the periphery of the hollow portion, or forming the isolation portion by the fifth dielectric layer and the sixth dielectric layer on the periphery of the hollow portion.

5. The manufacturing method of the semiconductor structure according to claim 4, after forming the isolation structures on the periphery of the gate layer, and before forming the insulating structure on the top surface of the isolation structures, the manufacturing method further comprises:
  forming an eighth dielectric layer on a surface of the seventh dielectric layer, wherein a top surface of the eighth dielectric layer is flush with a top surface of the seventh dielectric layer.

6. The manufacturing method of the semiconductor structure according to claim 5, wherein the forming the contact plugs comprises:
  forming a mask layer on a top surface of the insulating structure, wherein the mask layer is provided with mask openings;
  removing part of the insulating structure and part of the eighth dielectric layer along the mask openings, and forming trenches in the insulating structure and the eighth dielectric layer; and
  filling a conductive structure in each of the trenches, wherein ends of conductive structures close to the base are electrically connected to the active region in the base; the conductive structures are located on a side of the isolation portion away from the gate layer; and the conductive structures form the contact plugs.

7. The manufacturing method of the semiconductor structure according to claim 2, wherein a projection of the isolation structures close to a side of the source region on the base is located in the source low-doped region or overlaps with the source low-doped region.

8. The manufacturing method of the semiconductor structure according to claim 2, wherein a projection of the isolation structures close to a side of the drain region on the base is located in the drain low-doped region or overlaps with the drain low-doped region.

9. The manufacturing method of the semiconductor structure according to claim 1, wherein in the direction away from the gate layer, a thickness of each of the isolation structures is 15-40 nm.

10. The manufacturing method of the semiconductor structure according to claim 4, wherein the fifth dielectric layer and the seventh dielectric layer are made of a same material, the same material comprises silicon nitride;
  the sixth dielectric layer is made of a material, the material comprises an oxide.

11. The manufacturing method of the semiconductor structure according to claim 5, wherein the third dielectric layer and the insulating structure are made of a same material, the same material comprises silicon nitride;
  the eighth dielectric layer is made of a material, the material comprises an oxide.

12. The manufacturing method of the semiconductor structure according to claim 6, wherein the conductive structure is made of a material, the material comprises tungsten.

* * * * *